United States Patent
Tsukahara et al.

(10) Patent No.: US 6,347,221 B1
(45) Date of Patent: Feb. 12, 2002

(54) ORTHOGONAL MODULATOR HAVING A MODULATION MIXER

(75) Inventors: Masahiro Tsukahara; Koji Takekawa, both of Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/076,706

(22) Filed: May 13, 1998

(30) Foreign Application Priority Data

Nov. 25, 1997 (JP) .............................. 9-323164
Feb. 20, 1998 (JP) ........................... 10-038803

(51) Int. Cl.[7] ................................. H04B 1/28
(52) U.S. Cl. ...................... 455/333; 455/127; 455/93; 455/91
(58) Field of Search ........................... 45/323; 455/333, 455/91, 93, 295, 39, 296, 127; 332/103, 105, 104, 123; 327/356, 357, 359

(56) References Cited

U.S. PATENT DOCUMENTS

| | | | | |
|---|---|---|---|---|
| 3,555,358 A | * | 1/1971 | Gibbs | 361/56 |
| 3,596,184 A | * | 7/1971 | Hanus | 455/222 |
| 3,605,042 A | * | 9/1971 | Rapp | 330/192 |
| 3,649,760 A | * | 3/1972 | Glidden | 379/282 |
| 3,991,381 A | * | 11/1976 | Sechi | 330/277 |
| 5,309,429 A | * | 5/1994 | Fukuda | 370/280 |
| 5,392,460 A | * | 2/1995 | Mattila et al. | 455/76 |
| 5,446,422 A | * | 8/1995 | Mattila et al. | 332/103 |
| 5,706,311 A | * | 1/1998 | Koyama | 375/298 |
| 5,708,399 A | * | 1/1998 | Fujii et al. | 332/103 |
| 5,767,750 A | * | 6/1998 | Yamaji | 332/103 |
| 5,886,584 A | * | 3/1999 | Tanai et al. | 332/103 |

FOREIGN PATENT DOCUMENTS

| JP | 8-223233 | 8/1996 |
|---|---|---|
| JP | 9-153741 | 6/1997 |

* cited by examiner

*Primary Examiner*—Dwayne Bost
*Assistant Examiner*—Sonny Trinh
(74) *Attorney, Agent, or Firm*—Arent Fox Kintner Plotkin & Kahn, PLLC

(57) ABSTRACT

A modulation mixer includes a low cost circuit for reducing a carrier frequency leak. An orthogonal modulator including the modulation mixer may be formed on a single silicon substrate and does not need to be connected to an external transformer to suppress carrier frequency leak.

16 Claims, 10 Drawing Sheets

ORTHOGONAL MODULATOR HAVING A MODULATION MIXER

BACKGROUND OF THE INVENTION

The present invention relates to an orthogonal modulator for use in a digital mobile communication device, such as a portable telephone, and, more particularly, to an orthogonal modulator less susceptible to the influence of a carrier leak.

FIG. 1 is a schematic block diagram of a conventional orthogonal modulator 11. The orthogonal modulator 11 includes a frequency multiplier 12, a phase shifter 13, modulation mixers 14 and 15, and an adder 16, all formed on a single semiconductor substrate.

The orthogonal modulator 11 is connected to a transformer 17 called a balloon to suppress the occurrence of a carrier leak. The transformer 17 receives a carrier signal LOin and supplies a carrier signal LO in phase with the carrier signal LOin and a carrier signal LOx of the opposite phase to that of the carrier signal LOin, to the orthogonal modulator 11.

The frequency multiplier 12 multiplies the frequencies of the complementary carrier signals LO and LOx by two and supplies frequency-doubled carrier signals 2LO and 2LOx to the phase shifter 13. The phase shifter 13 divides the frequencies of the frequency-doubled carrier signals 2LO and 2LOx by two to generate four carrier signals LO0, LO90, LO180 and LO270 whose phases are shifted from one another by 90 degrees. The carrier signals LO0 and LO180 are complementary to each other, and the carrier signals LO90 and LO270 complementary to each other.

The modulation mixer 14 multiplies a baseband signal I or Ix by the carrier signal LO0 or LO180 to produce a first modulation signal V1. The modulation mixer 15 multiplies a baseband signal Q or Qx by the carrier signal LO90 or LO270 to produce a second modulation signal V2. The adder 16 adds the first and second modulation signals V1 and V2 together and outputs an output signal RFout.

A double mode phenomenon, which is caused by the carrier leak, makes the modulating operation of the orthogonal modulator 11 to be unstable. The double mode phenomenon includes a good mode which indicates the spectrum of the output signal RFout as shown in FIG. 3A and a bad mode indicating the spectrum of the output signal RFout as shown in FIG. 3B. The mode (i.e., the good mode or the bad mode) is determined by the timing of powering on a portable device and the carrier signals LO and LOx. Referring to FIGS. 3A and 3B, a component CL appears at the frequencies of the carrier signals LO and LOx, and a component Pout appears at positions shifted on the high-frequency side from the frequencies of the carrier signals LO and LOx by the frequencies of the baseband signals I to Qx. A component IR appears at positions shifted on the low-frequency side from the frequencies of the carrier signals LO and LOx by the frequencies of the baseband signals I to Qx.

It is believed that the double mode phenomenon may attributed to the following two factors. The first factor is phase differences between the carrier signal LO or LOx and the carrier signals LO0, LO90, LO180 and LO270. The phase shifter 13 operates to make the rising edge of the frequency-doubled carrier signal 2LO match with the rising edge of the carrier signal LO0. However, the rising edge of the carrier signal LO0 coincides with the rising edge of the carrier signal LO in some cases as shown in FIG. 2A and coincides with the falling edge of the carrier signal LO in other cases as shown in FIG. 2B. That is, the phase shifter 13 generates a carrier signal LO0 having a phase difference of 0 degrees to the carrier signal LO or a carrier signal LO0 having a phase difference of 180 degrees to the carrier signal LO.

The second factor is the generation of a direct current (DC) component on the output signal RFout. As the carrier signal LO or the output signal RFout has a high frequency, it easily leaks in space. As this leaked carrier enters the modulation mixers 14 and 15 through their input terminals, the DC component appears.

More specifically, the output signals Vout (output signals V1 and V2) of the modulation mixers 14 and 15 in an ideal state where the carrier signal LO does not leak are expressed by the following equation (1).

$$Vout = \cos(2\pi f_{LO}t) \times \cos(2\pi f_{BB}t) \quad (1)$$
$$= \frac{1}{2}\{\cos 2\pi(f_{LO} + f_{BB})t + \cos 2\pi(f_{LO} - f_{BB})t\}$$

When the leaked carrier signal LO is input to the input terminal for the baseband signal I, Ix, Q or Qx, the output signals Vout of the modulation mixers 14 and 15 are given by the following equation (2).

$$Vout = \cos(2\pi f_{LO}t + \phi_1) \times \cos(2\pi f_{LO}t + \phi_2) \quad (2)$$
$$= \frac{1}{2}\{\cos 2\pi(2f_{LO} + \phi_1 + \phi_2)t + \cos(\phi_1 - \phi_2)\}$$

where $\phi_1$ is the input phase of the original carrier signal LO and $\phi_2$ is the leak phase (phase delay) of the leaked carrier signal LO, with the baseband signals ignored for the sake of convenience. The leak phase $\phi_2$ is nearly constant, and the input phase $\phi_1$ is 0 degree or 180 degrees (90 degrees or 270 degrees). Thus, the second term in the equation (2) that represents the DC component has two values. The two values for the second term causes the double mode phenomenon. Note that the first term in the equation (2) is hardly affected by the input phase $\phi_1$ and the leak phase $\phi_2$ because $2f^{LO}$ is sufficiently larger than those phases.

Referring now to FIG. 4, an improved orthogonal modulator 21 suppresses the doube mode phenomenon is shown.

The improved orthogonal modulator 21 has two ½ frequency dividers 22 and 23, each of which includes a flip-flop type phase shifter.

The first ½ frequency divider 22 frequency-divides the carrier signal LO or LOx by two to yield frequency-divided signals of phases different by 90 degrees from each other. The second ½ frequency divider 23 frequency-divides the carrier signal LO or LOx by two to yield frequency-divided signals. A first modulation mixer 24 multiplies the first baseband signal I by the frequency-divided signal from the first ½ frequency divider 22. A second modulation mixer 25 multiplies the second baseband signal Q by the frequency-divided signal from the first ½ frequency divider 22.

An adder 26 combines the output signals, Iout and Qout, from the first and second modulation mixers 24 and 25, amplifies the resultant signal and outputs the amplified signal Sout. A frequency multiplier 27 multiplies the amplified signal Sout from the adder 26 by the output signal of the second ½ frequency divider 23 to yield an output signal RFout.

The output signals Iout and Qout of the first and second modulation mixers 24 and 25, the output signal Sout of the adder 26 and the output signal Vout of the frequency multiplier 27 are given by the following equations (3) to (6)

$$Iout = \cos(2\pi \cdot f_{LO}/2 \cdot t) \times \cos(2\pi f_{BB} t) \quad (3)$$
$$= \frac{1}{2}\{\cos 2\pi(f_{LO}/2 + f_{BB})t + \cos 2\pi(f_{LO}/2 - f_{BB})t\}$$

$$Qout = \cos(2\pi \cdot f_{LO}/2 \cdot t - 90°) \times \cos(2\pi f_{BB} t + 90°) \quad (4)$$
$$= \frac{1}{2}\{\cos 2\pi(f_{LO}/2 + f_{BB})t - \cos 2\pi(f_{LO}/2 - f_{BB})t\}$$

$$Sout = Iout + Qout \quad (5)$$
$$= \cos 2\pi(f_{LO}/2 + f_{BB})t$$

$$Vout = Sout \times \cos(2\pi \cdot f_{LO}/2 \cdot t) \quad (6)$$
$$= \cos 2\pi(f_{LO}/2 + f_{BB})t \times \cos(2\pi \cdot f_{LO}/2 \cdot t)$$
$$= \frac{1}{2}\{\cos 2\pi(f_{LO} + f_{BB})t + \cos 2\pi f_{BB} t\}$$

It is apparent from those equations (3) to (6) that the influence of the carrier leak is repressed. Further, the provision of the frequency multiplier 27 on the output terminal side allows the frequencies of the output signals Iout and Qout of the modulation mixers 24 and 25 to be half the frequencies of the output signals V1 and V2 of the modulation mixers 14 and 15 in FIG. 1. This ensures stable operation, and lower current consumption, of the orthogonal modulator 21.

The first and second ½ frequency dividers 22 and 23 have relative large circuit scales. Accordingly, the chip size of the orthogonal modulator 21 becomes inevitably larger, which stands in the way of size reduction of portable devices. Further, the increased chip size increases the cost of the orthogonal modulator 21 and eventually the costs of portable devices using or incorporating the modulator 21.

Accordingly, it is an objective of the present invention to provide a modulation mixer and an orthogonal modulator which reduce the influence of a carrier leak at a low cost.

SUMMARY OF THE INVENTION

Briefly stated, the present invention provides a modulation mixer for use in an orthogonal modulator, for combining a carrier signal having a high frequency and a baseband signal having a low frequency and outputting a modulation signal. The modulation mixer includes a transistor receiving the baseband signal, and an element, connected to the transistor, for reducing a high-frequency component of a signal including a leaked carrier signal input together with the baseband signal to the transistor.

The present invention provides a modulation mixer for use in an orthogonal modulator, for combining a carrier signal having a high frequency and a baseband signal having a low frequency and outputting a modulation signal. The modulation mixer includes a transistor receiving the baseband signal, and an element, connected to the transistor, for reducing a frequency characteristic of the transistor with respect to a high-frequency component of a signal including a leaked carrier signal input together with the baseband signal to the transistor.

The present invention provides a modulation mixer for use in an orthogonal modulator, for combining a carrier signal having a high frequency and a baseband signal having a low frequency and outputting a modulation signal. The modulation mixer includes a first transistor receiving the baseband signal, and a second transistor receiving the carrier signal. The first transistor has a larger size than the second transistor to reduce a frequency characteristic of the first transistor with respect to a high-frequency component of a signal including a leaked carrier signal input together with the baseband signal to the first transistor.

The present invention provides an orthogonal modulator for producing a modulation signal. The modulator includes a frequency multiplier receiving a carrier signal having a high frequency and producing a complementary frequency-multiplied signal having a frequency about two times the frequency of the carrier signal. A phase shifter is connected to the frequency multiplier, receives the complementary frequency-multiplied signal and frequency-divides the complementary frequency-multiplied signal by two to produce an in-phase carrier signal having an in-phase component and an orthogonal carrier signal having an orthogonal component. A first modulation mixer is connected to the phase shifter, receives the in-phase carrier signal and a first baseband signal having a lower frequency than the in-phase carrier signal and combines the in-phase carrier signal and the first baseband signal to produce a first modulation signal. A second modulation mixer is connected to the phase shifter, receives the orthogonal carrier signal and a second baseband signal having a lower frequency than the orthogonal carrier signal and combines the orthogonal carrier signal and the second baseband signal to produce a second modulation signal. An adder is connected to the first and second modulation mixers, receives the first and second modulation signals from the first and second modulation mixers and adds the first and second modulation signals to generate the modulation signal of the orthogonal modulator. The first modulation mixer includes a first transistor receiving the first baseband signal, and a first element, connected to the first transistor, for reducing a high-frequency component of a signal including a leaked carrier signal input together with the first baseband signal to the first transistor. The second modulation mixer includes a second transistor receiving the second baseband signal, and a second element, connected to the second transistor, for reducing a high-frequency component of a signal including a leaked carrier signal input together with the second baseband signal to the second transistor.

The present invention provides an orthogonal modulator for producing a modulation signal. The modulator includes a frequency multiplier for receiving a carrier signal having a high frequency and producing a complementary frequency-multiplied signal having a frequency about two times the frequency of the carrier signal. A phase shifter is connected to the frequency multiplier, receives the complementary frequency-multiplied signal, and frequency-divides the complementary frequency-multiplied signal by two to produce an in-phase carrier signal having an in-phase component and an orthogonal carrier signal having an orthogonal component. A first modulation mixer is connected to the phase shifter, receives the in-phase carrier signal and a first baseband signal having a lower frequency than the in-phase carrier signal and combines the in-phase carrier signal and the first baseband signal to produce a first modulation signal. A second modulation mixer is connected to the phase shifter, receives the orthogonal carrier signal and a second baseband signal having a lower frequency than the orthogonal carrier signal and combines the orthogonal carrier signal and the second baseband signal to produce a second modulation signal. An adder is connected to the first and second modulation mixers, receives the first and second modulation signals from the first and second modulation mixers and adds the first and second modulation signals to generate the modulation signal of the orthogonal modulator. The first modulation mixer includes a first transistor receiving the first baseband signal, and a first element, connected to the first transistor, for reducing a frequency characteristic of the first transistor with respect to a high-frequency component of a signal including a leaked carrier signal input together with the first baseband signal to the first transistor. The second modulation mixer includes a second transistor receiving the second baseband signal, and a second element, connected to the second transistor, for reducing a frequency characteristic of the second transistor with respect to a high-frequency component of a signal including a leaked carrier signal input together with the second baseband signal to the second transistor.

The present invention provides an orthogonal modulator for producing a modulation signal. The modulator includes a frequency multiplier for receiving a carrier signal having a high frequency and producing a complementary frequency-multiplied signal a frequency about two times the frequency of the carrier signal. A phase shifter is connected to the frequency multiplier, receives the complementary frequency-multiplied signal and frequency-divides the complementary frequency-multiplied signal by two to produce an in-phase carrier signal having an in-phase component and an orthogonal carrier signal having an orthogonal component. A first modulation mixer is connected to the phase shifter, receives the in-phase carrier signal and a first baseband signal having a lower frequency than the in-phase carrier signal, and combines the in-phase carrier signal and the first baseband signal to produce a first modulation signal. A second modulation mixer is connected to the phase shifter, receives the orthogonal carrier signal and a second baseband signal having a lower frequency than the orthogonal carrier signal, and combines the orthogonal carrier signal and the second baseband signal to produce a second modulation signal. An adder is connected to the first and second modulation mixers, receives the first and second modulation signals from the first and second modulation mixers and adds the first and second modulation signals to generate the modulation signal of the orthogonal modulator. The first modulation mixer includes a first transistor receiving the first baseband signal, and a second transistor receiving the in-phase carrier signal. The first transistor has a larger size than the second transistor to reduce a frequency characteristic of the first transistor with respect to a high-frequency component of a signal including a leaked carrier signal input together with the first baseband signal to the first transistor. The second modulation mixer includes a third transistor receiving the second baseband signal, and a fourth transistor receiving the orthogonal carrier signal. The third transistor has a larger size than the fourth transistor to reduce a frequency characteristic of the third transistor with respect to a high-frequency component of a signal including a leaked carrier signal input together with the second baseband signal to the third transistor.

The present invention provides an orthogonal modulator for producing a modulation signal. The modulator includes a phase shifter for receiving a carrier signal having a predetermined frequency and dividing the frequency of the carrier signal by two to generate an in-phase carrier signal having an in-phase component and an orthogonal carrier signal having an orthogonal component. A first modulation mixer is connected to the phase shifter, receives the in-phase carrier signal and a first baseband signal having a lower frequency than the in-phase carrier signal and combines the in-phase carrier signal and the first baseband signal to produce a first modulation signal. A second modulation mixer is connected to the phase shifter, receives the orthogonal carrier signal and a second baseband signal having a lower frequency than the orthogonal carrier signal and combines the orthogonal carrier signal and the second baseband signal to produce a second modulation signal. A first frequency multiplier is connected to the first modulation mixer and the phase shifter, receives the first modulation signal and one of the in-phase carrier signal and the orthogonal carrier signal and multiplies the first modulation signal by the one of the in-phase carrier signal and the orthogonal carrier signal to produce a third modulation signal. A second frequency multiplier is connected to the second modulation mixer and the phase shifter, receives the second modulation signal and one of the in-phase carrier signal and the orthogonal carrier signal and multiplies the second modulation signal by the one of the in-phase carrier signal and the orthogonal carrier signal to produce a fourth modulation signal. An adder is connected to the first and second frequency multipliers, receives the third and fourth modulation signals and adds the third and fourth modulation signals to produce the modulation signal of the orthogonal modulator.

The present invention provides an orthogonal modulator for producing a modulation signal. The modulator includes a phase shifter for receiving a carrier signal having a predetermined frequency and dividing the frequency of the carrier signal by two to generate an in-phase carrier signal having an in-phase component and an orthogonal carrier signal having an orthogonal component. A first modulation mixer is connected to the phase shifter, receives the in-phase carrier signal and a first baseband signal having a lower frequency than the in-phase carrier signal and combines the in-phase carrier signal and the first baseband signal to produce a first modulation signal. A second modulation mixer is connected to the phase shifter, receives the in-phase carrier signal and a second baseband signal having a lower frequency than the in-phase carrier signal and combines the in-phase carrier signal and the second baseband signal to produce a second modulation signal. A first frequency multiplier is connected to the first modulation mixer and the phase shifter, receives the first modulation signal and the in-phase carrier signal and multiplies the first modulation signal by the in-phase carrier signal to produce a third modulation signal. A second frequency multiplier is connected to the second modulation mixer and the phase shifter, receives the second modulation signal and the orthogonal carrier signal and multiplies the second modulation signal by the orthogonal carrier signal to produce a fourth modulation signal. An adder is connected to the first and second frequency multipliers, receives the third and fourth modulation signals and adds the third and fourth modulation signals to produce the modulation signal of the orthogonal modulator.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 5:
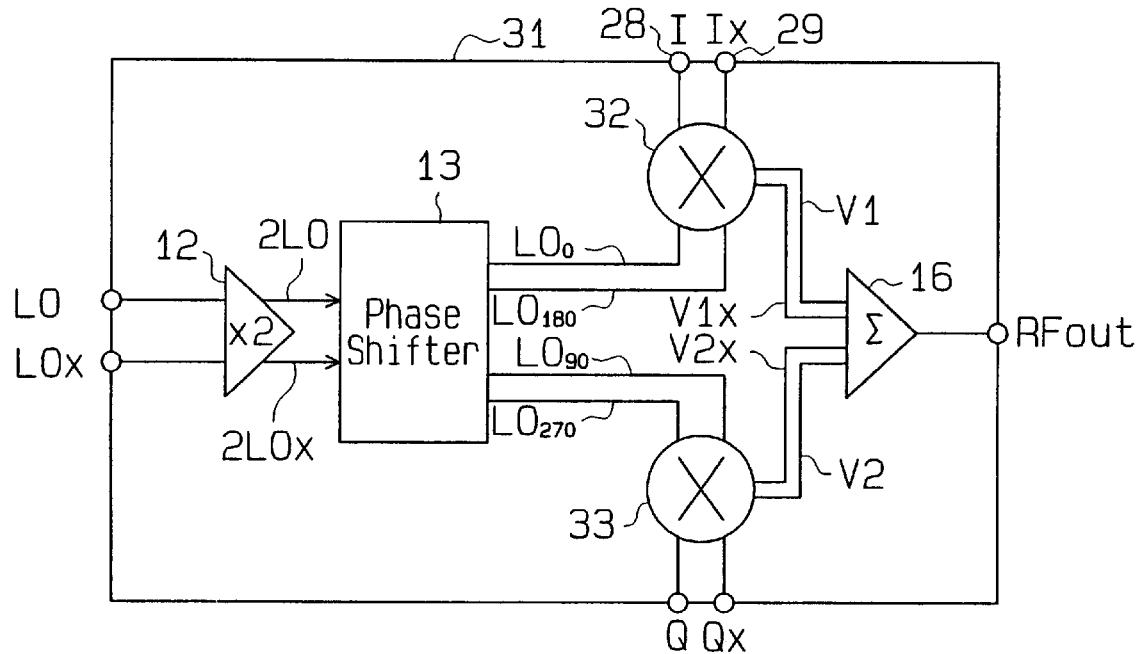
FIG. 5 is a schematic block diagram showing an orthogonal modulator according to a first embodiment of this invention.

FIG. 5 is a schematic block diagram of an orthogonal modulator 31 according to a first embodiment of the present invention. The orthogonal modulator 31 comprises a frequency multiplier 12, a phase shifter 13, first and second modulation mixers 32 and 33, and an adder 16, preferably all formed on a single semiconductor substrate.

The frequency multiplier 12 receives complementary carrier signals LO and LOx and multiplies their frequencies by two to produce frequency-doubled complementary carrier signals 2LO and 2LOx, which are sent to the phase shifter 13.

The phase shifter 13 divides the frequencies of the frequency-doubled carrier signals 2LO and 2LOx by two to generate four carrier signals LO0, LO90, LO180 and LO270 whose phases are shifted from one another by 90 degrees. The carrier signals LO0 and LO180 are complementary to each other, and are the in-phase components of the carrier signals LO and LOx (hereinafter called in-phase carrier signals). The carrier signals LO90 and LO270 are complementary to each other, and are the orthogonal components of the carrier signals LO and LOx (hereinafter called orthogonal carrier signals LO90 and LO270).

The first modulation mixer 32 receives the in-phase carrier signal LO0 or LO180 from the phase shifter 13 and multiplies a first digital baseband signal I or Ix by the in-phase carrier signal LO0 or LO180 to produce a first modulation signal V1 or V1x.

The second modulation mixer 33 receives the orthogonal carrier signal LO90 or LO270 from the phase shifter 13 and multiplies a second digital baseband signal Q or Qx by the orthogonal carrier signal LO90 or LO270 to produce a second modulation signal V2 or V2x. The adder 16 receives the first modulation signal V1 or V1x and the second modulation signal V2 or V2x from the modulation mixers 32 and 33, and adds the second modulation signal V2 or V2x to the first modulation signal V1 or V1x to yield an output signal RFout.

Figure 6:
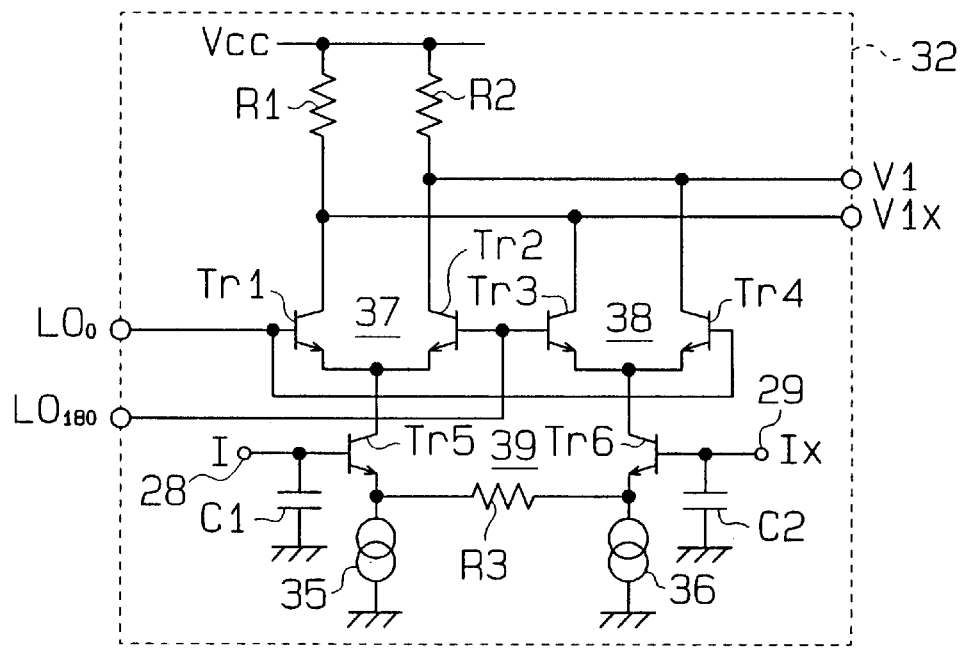
FIG. 6 is a circuit diagram of a modulation mixer of the orthogonal modulator of FIG. 5.

FIG. 6 is a circuit diagram of the first modulation mixer 32. As the second modulation mixer 33 preferably has the same structure as the first modulation mixer 32, a diagram and detailed description thereof will be omitted. The first modulation mixer 32 is a double balanced mixer (DBM) which includes transistors Tr1 to Tr6, resistors R1 to R3, constant current sources 35 and 36, and capacitors C1 and C2.

The first transistor Tr1 has an emitter, a collector connected via the resistor R1 to the power supply line of a high-potential power supply Vcc, and a base which receives the in-phase carrier signal LO0. The second transistor Tr2 has an emitter connected to the emitter of the first transistor Tr1, a collector connected via a resistor R2 to the power supply line of the high-potential power supply Vcc, and a base which receives the in-phase carrier signal LO180. The first and second transistors Tr1 and Tr2 form a first differential pair 37.

The third transistor Tr3 has an emitter, a collector connected via the resistor R1 to the power supply line of the high-potential power supply Vcc, and a base which receives the in-phase carrier signal LO180. The fourth transistor Tr4 has an emitter connected to the emitter of the third transistor Tr3, a collector connected via the resistor R2 to the power supply line of the high-potential power supply Vcc, and a base which receives the in-phase carrier signal LO0. The third and fourth transistors Tr3 and Tr4 form a second differential pair 38. Also, the bases of second and third transistors are connected to each other.

The fifth transistor Tr5 has an emitter connected via a constant current source 35 to the power supply line of a low-potential power supply (ground GND), a collector connected to the emitters of the first and second transistors Tr1 and Tr2, and a base which receives the baseband signal I. The base of the fifth transistor Tr5 is connected to a baseband input terminal 28, and a node between this base and the input terminal 28 is grounded via a capacitor C1. The capacitor C1 reduces the high-frequency component included in the signal applied to the base of the transistor Tr5.

The sixth transistor Tr6 has an emitter connected via a constant current source 36 to the power supply line of the low-potential power supply (ground GND), a collector connected to the emitters of the third and fourth transistors Tr3 and Tr4, and a base which receives the baseband signal Ix. The base of the sixth transistor Tr6 is connected to a baseband input terminal 29, and a node between this base and the input terminal 29 is grounded via a capacitor C2, which reduces the high-frequency component included in the signal applied to the base of the transistor Tr6. The emitter of the fifth transistor Tr5 is connected to the emitter of the sixth transistor Tr6 via the resistor R3. The fifth and sixth transistors Tr5 and Tr6 form a third differential pair 39.

The first modulation signal V1x is output from the collectors of the first and third transistors Tr1 and Tr3, and the first modulation signal V1 is output from the collectors of the second and fourth transistors Tr2 and Tr4.

In the case of the orthogonal modulator 31 of a 1 GHz band, for example, the carrier signals LO and LOx (output signal RFout) have frequencies of approximately 900 MHZ, and the first and second baseband signals I to Qx have frequencies of approximately 100 KHz. The capacitors C1 and C2 have capacitances (about 10 pF to about 100 pF) large enough to reduce the frequency component of approximately 900 MHZ. The capacitors C1 and C2 having such capacitances hardly affect the first baseband signals I and Ix.

When the leaked carrier signal LO or LOx, or the output signal RFout is input together with the first baseband signal I or Ix to the associated baseband input terminal 28 or 29, the high-frequency component of the carrier signal LO or LOx, or the output signal RFout is decreased by the associated capacitor C1 or C2. As a result, the bases of the fifth and sixth transistors Tr5 and Tr6 mostly receive the first baseband signals I and Ix respectively. This reduces the influence of the carrier leak on the first modulation signal V1 or V1x output from the first modulation mixer 32 or the output signal RFout output from the orthogonal modulator 31.

Figure 7:
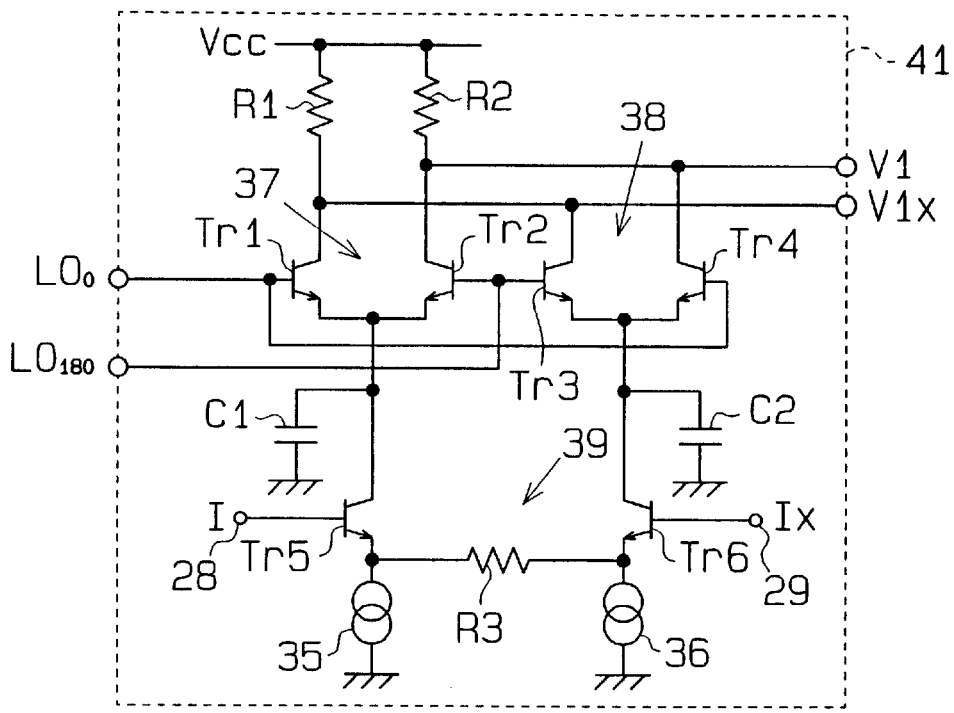
FIG. 7 is a circuit diagram of a first modification of the modulation mixer of FIG. 5.

FIG. 7 is a circuit diagram of a first alternative modulation mixer 41, which is a first modification of the modulation mixer 21. As shown in FIG. 7, the collectors of the fifth and sixth transistors Tr5 and Tr6 are grounded via the capacitors C1 and C2. The capacitors C1 and C2 decrease the high-frequency components included in signals that are amplified by the fifth and sixth transistors Tr5 and Tr6. Consequently, the influence caused by the carrier leak is reduced.

Figure 8:
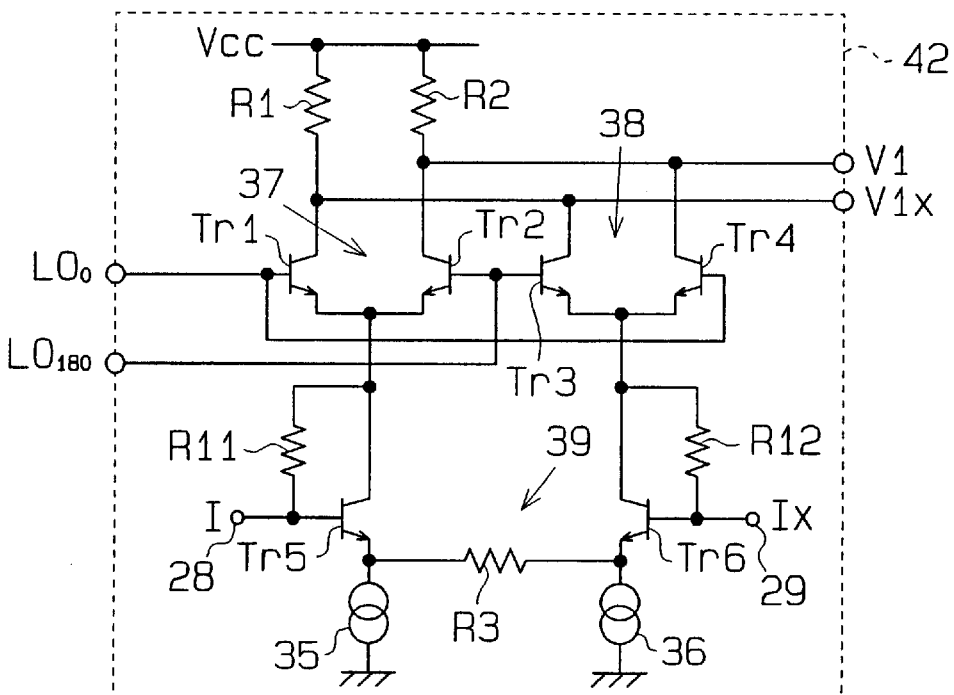
FIG. 8 is a circuit diagram showing a second modification of the modulation mixer of FIG. 5.

FIG. 8 is a circuit diagram of a second alternative modulation mixer 42. As shown in FIG. 8, a negative feedback resistor R11 is provided between the base and collector of the fifth transistor Tr5, and a negative feedback resistor R12 is provided between the base and collector of the sixth transistor Tr6. The resistors R11 and R12 provide the fifth and sixth transistors Tr5 and Tr6 with DC and AC feedbacks. The amplification factors for the high-frequency signals of the fifth and sixth transistors Tr5 and Tr6 decrease when the resistors R11 and R12 have low resistances. That is, the resistors R11 and R12 degrade the high frequency characteristics of the fifth and sixth transistors Tr5 and Tr6, reducing the amplification factors for their high-frequency signals. This decreases the conversion gains of the modulation mixers 32 and 33, making the value of the second term (DC component) in the equation (2) smaller, which reduces the influence of the carrier leak on the output signal RFout.

It is preferable that the resistances of the resistors R11 and R12 are set smaller than that of the resistor R3 and small enough to avoid a diode connection of the fifth and sixth transistors Tr5 and Tr6. When the resistor R3 has a resistance of about 1000 ohms to about 100 ohms, for example, the resistors R11 and R12 should preferably have resistances of about 100 ohms to about 10 ohms.

Figure 9:
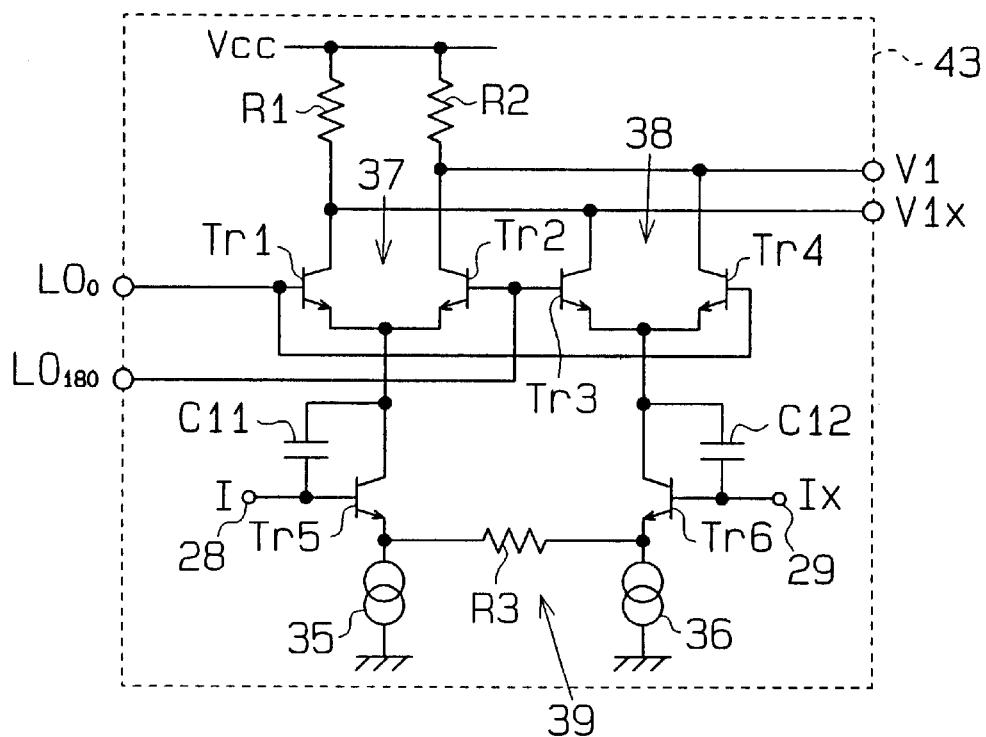
FIG. 9 is a circuit diagram depicting a third modification of the modulation mixer of FIG. 5.

FIG. 9 is a circuit diagram of a third alternative modulation mixer 43. As shown in FIG. 9, a negative feedback capacitor C11 is provided between the base and collector of the fifth transistor Tr5, and a negative feedback capacitor C12 is provided between the base and collector of the sixth transistor Tr6. The capacitors C11 and C12 provide the fifth and sixth transistors Tr5 and Tr6 with AC feedbacks. The amplification factors of the fifth and sixth transistors Tr5 and Tr6 decrease as the frequency of the input signal gets higher. That is, the capacitors C11 and C12 deteriorate the high frequency characteristics of the fifth and sixth transistors Tr5 and Tr6.

Figure 10:
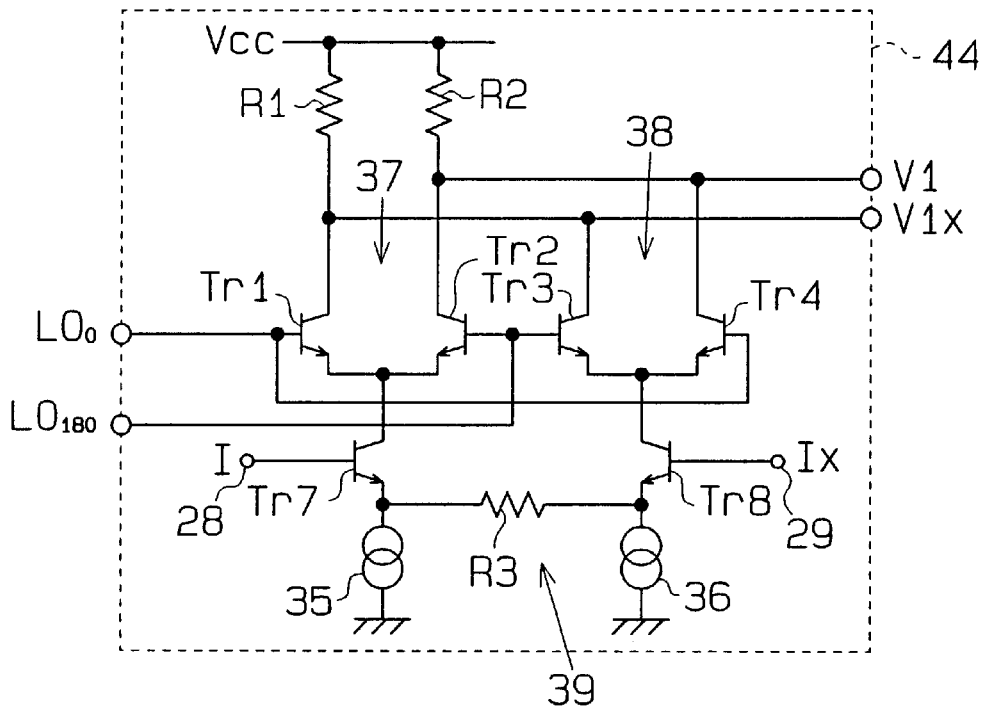
FIG. 10 is a circuit diagram of a fourth modification of the modulation mixer of FIG. 5.

FIG. 10 is a circuit diagram of a fourth alternative modulation mixer 44. The modulation mixer 44 in FIG. 10 includes seventh and eighth transistors Tr7 and Tr8 which are larger in size than the fifth and sixth transistors Tr5 and Tr6. The sizes of the seventh and eighth transistors Tr7 and Tr8 are greater than those of the first to sixth transistors Tr1-Tr6 by about ten times to about twenty times. The high frequency characteristics of the seventh and eighth transistors Tr7 and Tr8 are lower than those of the first to fourth transistors Tr1-Tr4, which are smaller in size. The seventh and eighth transistors Tr7 and Tr8 therefore amplify the leaked carrier signal LO or LOx, or the output signal RFout with a lower amplification factor, which results in reduced influence of the carrier leak on the output signal RFout.

Figure 1:
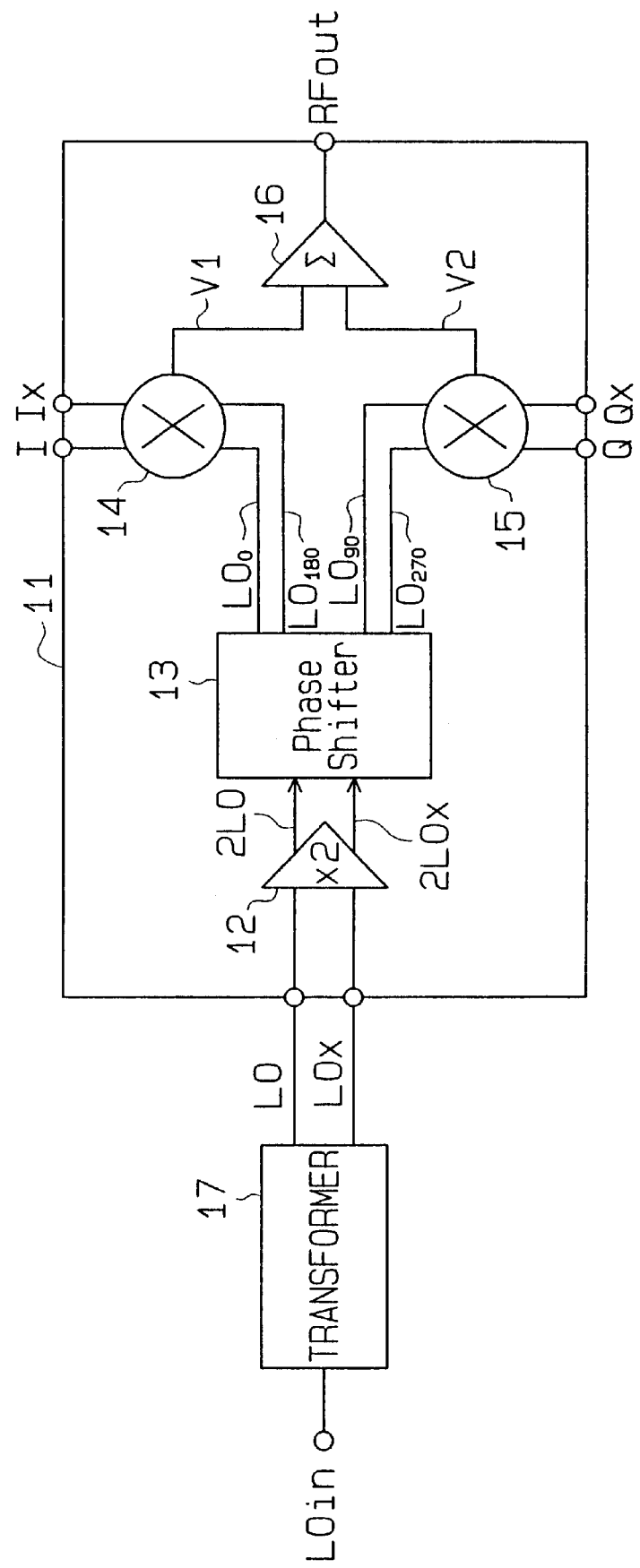
FIG. 1 is a schematic block diagram of a first conventional orthogonal modulator.
Figure 2A:
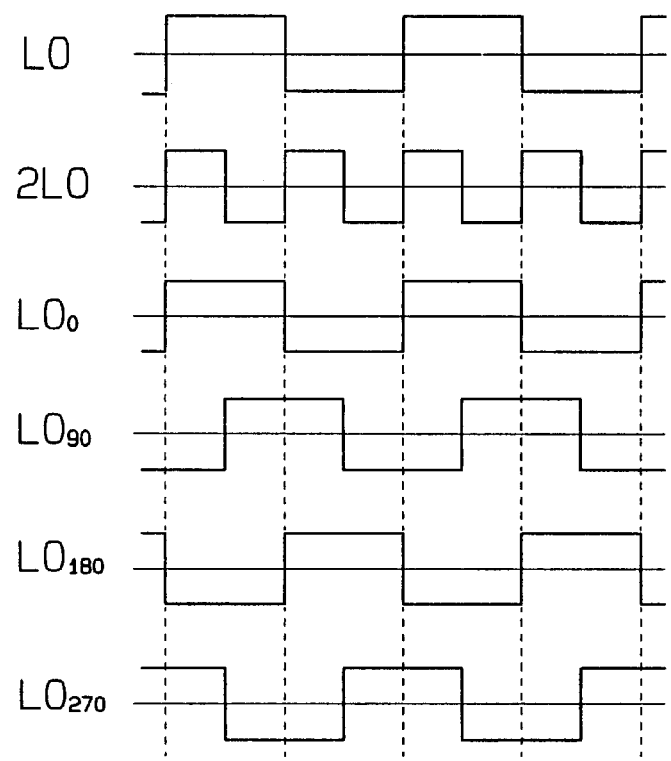
FIGS. 2A and 2B are waveform charts of signals generated by the orthogonal modulator of FIG. 1.
Figure 2B:
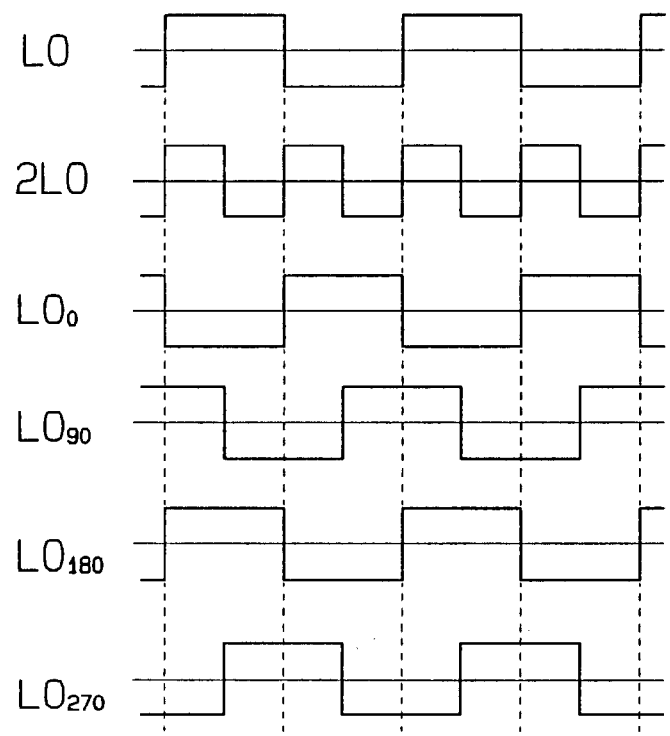
Figure 3A:
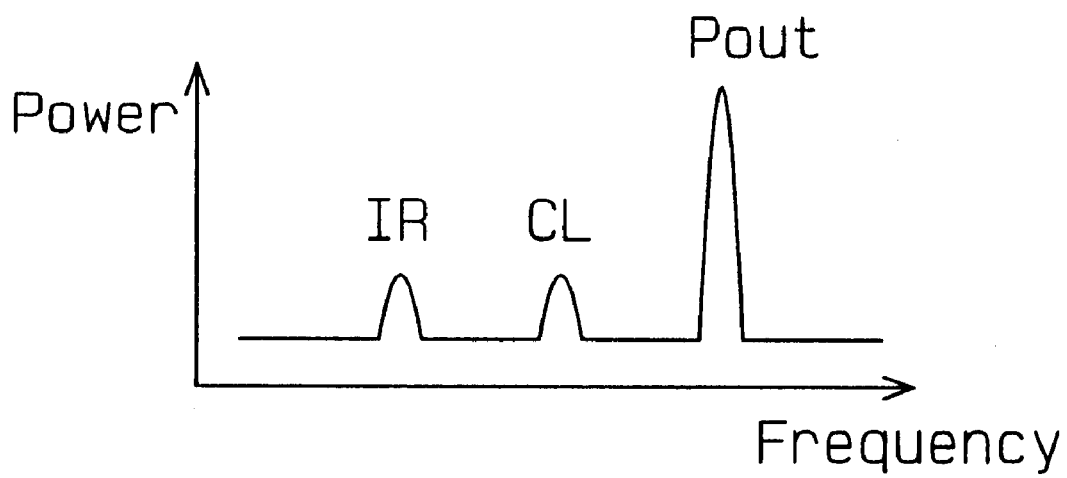
FIGS. 3A and 3B are spectrum waveform diagrams of signals output from the orthogonal modulator of FIG. 1.
Figure 3B:
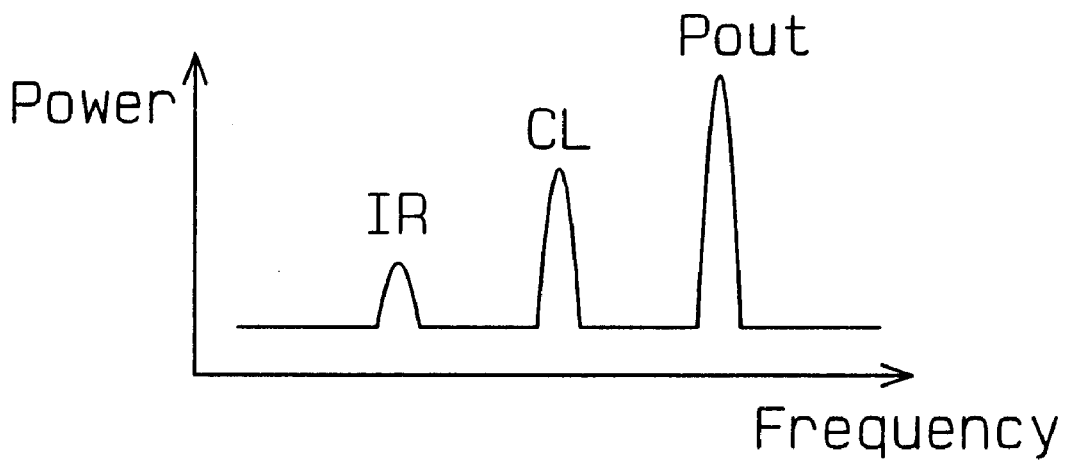
Figure 11:
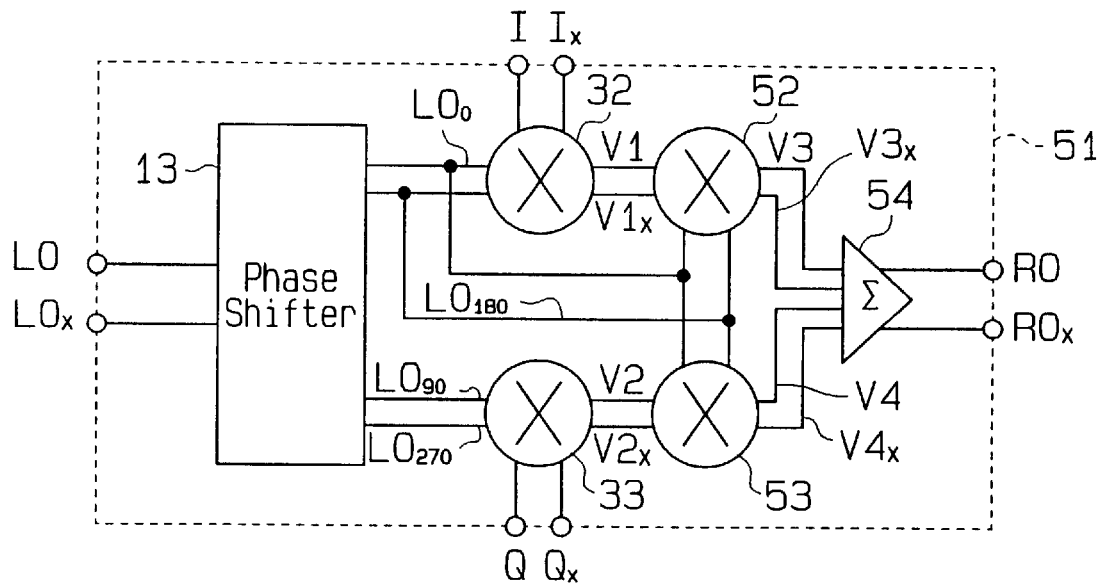
FIG. 11 is a schematic block diagram illustrating an orthogonal modulator according to a second embodiment of this invention.

FIG. 11 is a schematic block diagram of an orthogonal modulator 51 according to a second embodiment of the present invention. The orthogonal modulator 51 comprises a phase shifter 13, first and second modulation mixers 32 and 33, first and second frequency multipliers 52 and 53, and an adder 54, all formed on a semiconductor chip. The first and second modulation mixers 32 and 33 may be replaced with the modulation mixers 14 and 15 in FIG. 1 or the modulation mixers 24 and 25 in FIG. 4.

The phase shifter 13, which is preferably a flip-flop type phase shifter, receives complementary carrier signals LO and LOx and frequency-divides the carrier signals LO and LOx to generate carrier signals LO0, LO90, LO180 and LO270 whose phases are shifted from one another by 90 degrees.

The first modulation mixer 32 receives the in-phase carrier signal LO0 or LO180 from the phase shifter 13 and the second modulation mixer 33 receives the orthogonal carrier signal LO90 or LO270 from the phase shifter 13. The frequencies of the carrier signals received by the first and second modulation mixers 32 and 33 are half the frequencies of the carrier signals received by the first and second modulation mixers 14 and 15 in FIG. 1. Therefore, the current consumption of the first and second modulation mixers 32 and 33 of the orthogonal modulator 51 is reduced.

The first modulation mixer 32 multiplies the first baseband signal I or Ix by the in-phase carrier signal LO0 or LO180 to yield a first modulation signal V1 or V1x. The second modulation mixer 33 multiplies the second baseband signal Q or Qx by the orthogonal carrier signal LO90 or LO270 to yield a second modulation signal V2 or V2x.

The first frequency multiplier 52, connected between the adder 54 and the first modulation mixer 32, multiplies the first modulation signal V1 or V1x by the in-phase carrier signal LO0 or LO180 to produce a third modulation signal V3 or V3x. The first modulation signals V1 and V1x have substantially the same frequencies as the in-phase carrier signals LO0 and LO180. Therefore, the first frequency multiplier 52 outputs the third modulation signal V3 or V3x which has double the frequency of the in-phase carrier signal LO0 or LO180.

The second frequency multiplier 53, connected between the adder 54 and the second modulation mixer 33, multiplies the second modulation signal V2 or V2x by the in-phase carrier signal LO0 or LO180 to produce a fourth modulation signal V4 or V4x. The second modulation signals V2 and V2x have substantially the same frequencies as the orthogonal carrier signals LO90 and LO270. Therefore, the second frequency multiplier 53 outputs the fourth modulation signal V4 or V4x which has double the frequency of the orthogonal carrier signal LO90 or LO270.

The adder 54 adds the third and fourth modulation signals V3 or V3x, and V4 or V4x to produce complementary output signals RO and ROx.

Figure 12:
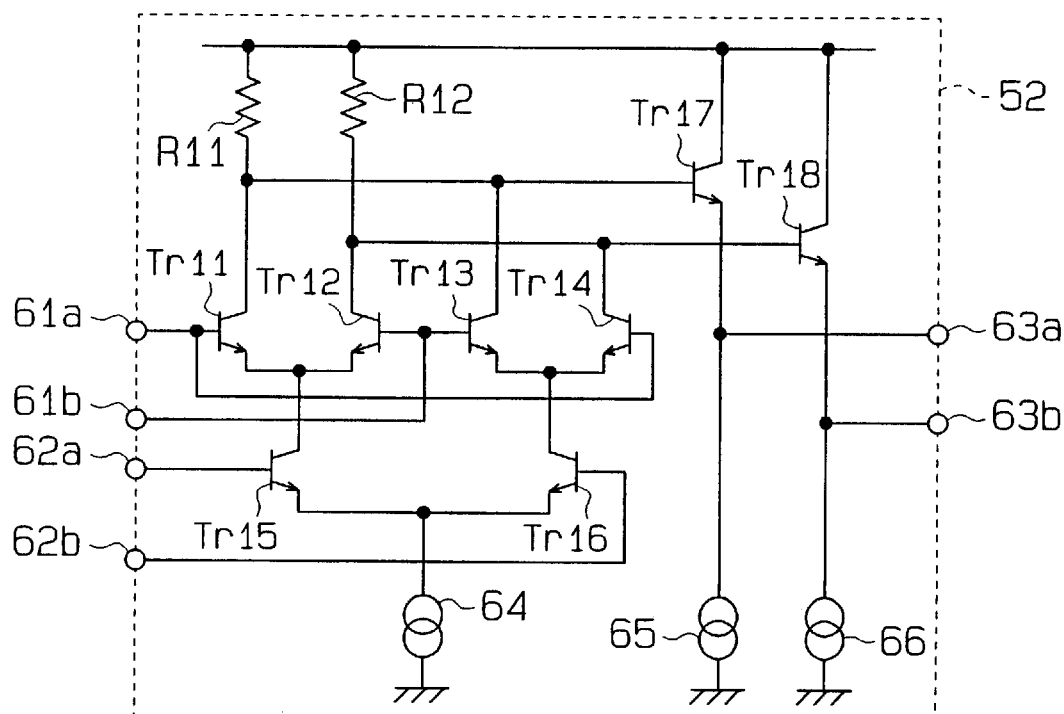
FIG. 12 is a circuit diagram of a frequency multiplier of the orthogonal modulator of FIG. 11.

FIG. 12 is a schematic circuit diagram of the first frequency multiplier 52 including transistors Tr11 to Tr18, resistors R11 and R12 and constant current sources 64 to 66.

The first and second transistors Tr11 and Tr12 have emitters connected together, bases connected respectively to input terminals 61a and 61b, and collectors connected to the power supply line of the high-potential power supply via the respective resistors R11 and R12, and form a differential amplifier. The third and fourth transistors Tr13 and Tr14 have emitters connected together, bases connected respectively to the input terminals 61b and 61a, and collectors connected to the power supply line of the high-potential power supply via the respective resistors R11 and R12, and also form a differential amplifier. The base of the fourth transistor Tr14 is also connected to the base of the first transistor Tr11. The fifth and sixth transistors Tr15 and Tr16 have emitters connected together, bases connected respectively to input terminals 62a and 62b, and collectors connected to the power supply line of the low-potential power supply (ground GND) via the constant current source 64, and form another differential amplifier. The collector of the fifth transistor Tr15 is connected to the emitters of the first and second transistors Tr11 and Tr12. The collector of the sixth transistor Tr16 is connected to the emitters of the third and fourth transistors Tr13 and Tr14.

The seventh transistor Tr17 has a base connected to the collectors of the first and third transistors Tr11 and Tr13, a collector connected to the power supply line of the high-potential power supply, an emitter connected to an output terminal 63a and to the power supply line of the low-potential power supply via the constant current source 65. The eighth transistor Tr18 has a base connected to the collectors of the second and fourth transistors Tr12 and Tr14, a collector connected to the power supply line of the high-potential power supply, an emitter connected to an output terminal 63b and to the power supply line of the low-potential power supply via the constant current source 66.

The first modulation signals V1 and V1x from the first modulation mixer 32 are respectively input to the input terminals 61a and 61b, and the in-phase carrier signals LO0 and LO180 from the phase shifter 13 are respectively input to the input terminals 62a and 62b. Alternatively, the in-phase carrier signals LO0 and LO180 may respectively be input to the input terminals 61a and 61b, and the first modulation signals V1 and V1x may respectively be input to the input terminals 62a and 62b. The modulation signals V3 and V3x are output from the output terminals 63a and 63b.

The operation of the orthogonal modulator 51 will now be described with reference to equations given below. The output signal Iout (the first modulation signal V1 or V1x) of the first modulation mixer 32 is given by the following equation (7).

$$Iout = \cos(2\pi \cdot f_{LO}/2 \cdot t) \times \cos(2\pi f_{BB} t) \quad (7)$$
$$= \frac{1}{2}\{\cos 2\pi(f_{LO}/2 + f_{BB})t + \cos 2\pi(f_{LO}/2 - f_{BB})t\}$$

where $f_{LO}$ indicates the frequencies of the carrier signals LO and LOx and $f_{BB}$ indicates the frequencies of the first and second baseband signals I, Ix, Q and Qx.

The output signal Iout2 (the third modulation signal V3 or V3x) of the first frequency multiplier 52 is given by the following equation (8).

$$Iout2 = \frac{1}{2}\{\cos 2\pi(f_{LO}/2 + f_{BB})t + \cos 2\pi(f_{LO}/2 - f_{BB})t\} \times \quad (8)$$
$$\cos(2\pi \cdot f_{LO}/2 \cdot t)$$
$$= \frac{1}{4}\{\cos 2\pi(f_{LO} + f_{BB})t + \cos 2\pi f_{BB} t + \cos 2\pi(f_{LO} - f_{BB})t + \cos 2\pi f_{BB} t\}$$

The output signal Qout (the second modulation signal V2 or V2x) of the second modulation mixer 33 is given by the following equation (9).

$$Qout = \cos(2\pi \cdot f_{LO}/2 \cdot t - 90°) \times \cos(2\pi f_{BB} t + 90°) \quad (9)$$
$$= \frac{1}{2}\{\cos 2\pi(f_{LO}/2 + f_{BB})t - \cos 2\pi(f_{LO}/2 - f_{BB})t\}$$

The output signal Qout2 (the fourth modulation signal V4 or V4x) of the second frequency multiplier 53 is given by the following equation (10).

$$Qout2 = \frac{1}{2}\{\cos 2\pi(f_{LO}/2 + f_{BB})t - \cos 2\pi(f_{LO}/2 - f_{BB})t\} \times \quad (10)$$
$$\cos(2\pi \cdot f_{LO}/2 \cdot t)$$
$$= \frac{1}{4}[\{\cos 2\pi(f_{LO} + f_{BB})t + \cos 2\pi f_{BB} t\} - \{\cos 2\pi(f_{LO} - f_{BB})t + \cos 2\pi f_{BB} t\}]$$

The output signal Out (the output signal RO or ROx) of the adder 54 given by the following equation (11).

$$Out = Iout2 + Qout2 \quad (11)$$
$$= \frac{1}{2}\{\cos 2\pi(f_{LO} + f_{BB})t + \cos 2\pi f_{BB} t\}$$

When the baseband frequency $f_{BB}$ is approximately 100 KHz and the carrier frequency $f_{LO}$ is about 1 GHz, for example, the value of the second term in the equation (11) becomes significantly small and hardly affects the output signal Out. That is, the value of the second term can be ignored. The output signal of the adder 54 can essentially be considered to have the value of the first term alone. The influence of the carrier leak on the output signal Out is thus reduced.

Figure 4:
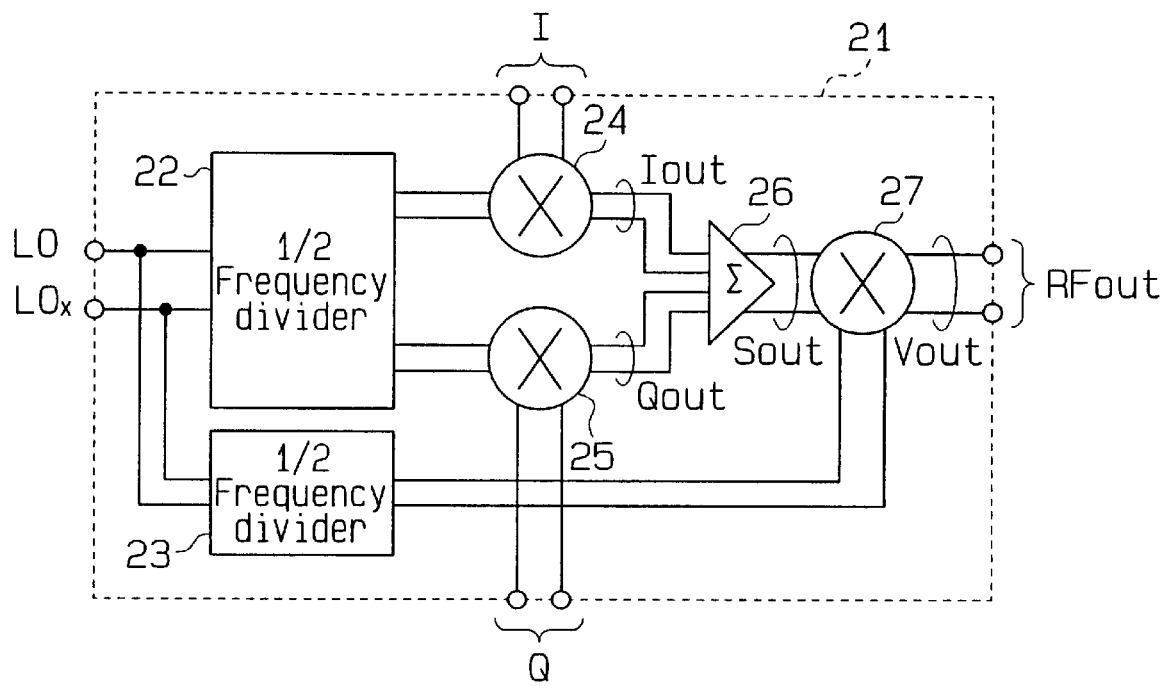
FIG. 4 is a schematic block diagram of a second conventional orthogonal modulator.
Figure 13:
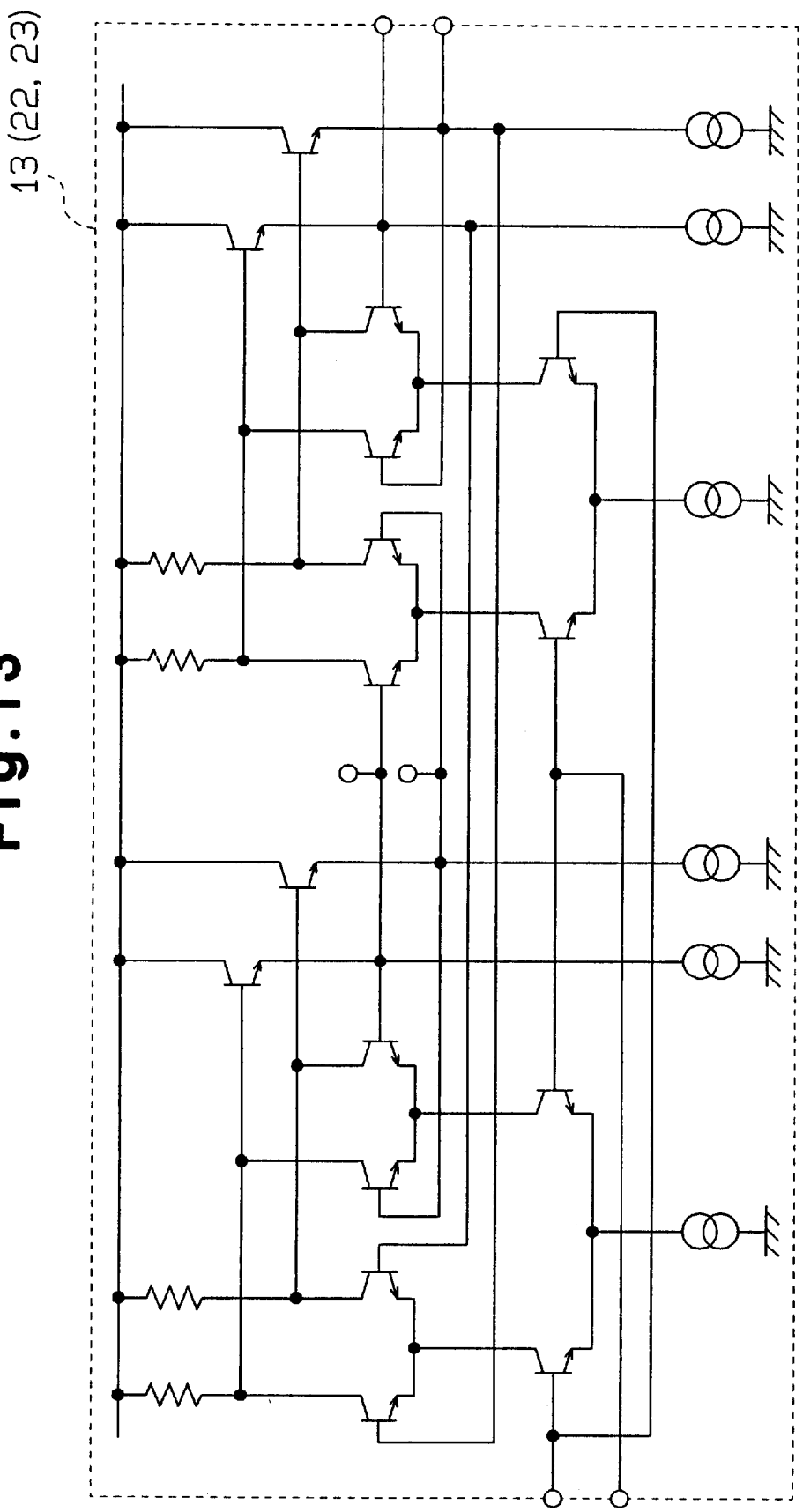
FIG. 13 is a circuit diagram of a phase shifter of the orthogonal modulator of FIG. 11 which has the same structure as a frequency divider of FIG. 4.

The orthogonal modulator 51 in FIG. 11 according to the second embodiment has a smaller circuit area than the conventional orthogonal modulator 21 in FIG. 4. Referring to FIG. 11 in comparison with FIG. 4, the circuit area of the phase shifter 13 is the same as the first or second ½ frequency divider 22 or 23. FIG. 13 is a circuit diagram of the phase shifter 13 or the first or second ½ frequency divider 22 or 23. The total circuit area of the first and second frequency multipliers 52 and 53 is substantially the same as the circuit area of the first or second ½ frequency divider 22 or 23. The orthogonal modulator 51 therefore has a smaller circuit area than the orthogonal modulator 21 in FIG. 4 by the circuit area of the frequency multiplier 27. This structure reduces the size and cost of the orthogonal modulator 51, and thus, a portable device using the same.

Figure 14:
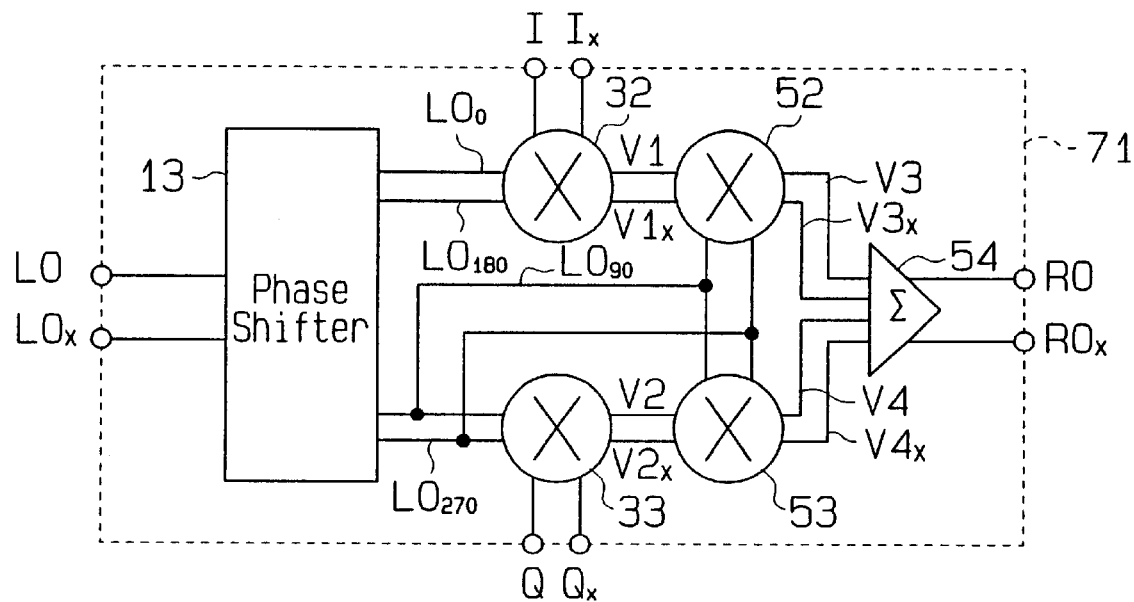
FIG. 14 is a schematic block diagram of a first modification of the orthogonal modulator of FIG. 11.

FIG. 14 is a schematic block diagram of an orthogonal modulator 71 according to a first modification of the second embodiment. As shown in FIG. 14, the first frequency multiplier 52 of the orthogonal modulator 71 multiplies the first modulation signal V1 or V1x output from the first modulation mixer 32 by the orthogonal carrier signal LO90 or LO270 to produce a third modulation signal V3 or V3x. The second frequency multiplier 53 multiplies the second modulation signal V2 or V2x output from the second modulation mixer 33 by the orthogonal carrier signal LO90 or LO270 to produce a fourth modulation signal V4 or V4x.

In the first modification, the output signal Iout2 (the third modulation signal V3 or V3x) of the first frequency multiplier 52 is given by the following equation (12).

$$Qout2 = \frac{1}{2}\{\cos 2\pi(f_{LO}/2 + f_{BB})t + \cos 2\pi(f_{LO}/2 - f_{BB})t\} \times \quad (12)$$
$$\cos(2\pi \cdot f_{LO}/2 \cdot t - 90°)$$
$$= \frac{1}{4}[\cos\{2\pi(f_{LO} + f_{BB})t - 90°\} + \{\cos 2\pi f_{BB}t + 90°\} + \cos\{2\pi(f_{LO} - f_{BB})t - 90°\} + \cos\{2\pi f_{BB}t + 90°\}]$$

The output signal Qout2 (the fourth modulation signal V4 or V4x) of the second frequency multiplier 53 is given by the following equation (13).

$$Qout2 = \frac{1}{2}\{\cos 2\pi(f_{LO}/2 + f_{BB})t - \cos 2\pi(f_{LO}/2 - f_{BB})t\} \times \quad (13)$$
$$\cos(2\pi \cdot f_{LO}/2 \cdot t - 90°)$$
$$= \frac{1}{4}[\cos\{2\pi(f_{LO} + f_{BB})t - 90°\} + \{\cos 2\pi f_{BB}t + 90°\} - \{\cos\{2\pi(f_{LO} - f_{BB})t - 90°\} + \cos(2\pi f_{BB}t + 90°)\}]$$

The output signal Out (the output signal RO or ROx) of the adder 54 is given by the following equation (14).

$$Out = Iout2 + Qout2 \quad (14)$$
$$= \frac{1}{2}[\cos\{2\pi(f_{LO} + f_{BB})t - 90°\} + \cos(2\pi f_{BB}t + 90°)]$$

It is apparent from the equation (14) that the orthogonal modulator 71 of the first modification reduces the influence of the carrier leak to the output signal Out.

Figure 15:
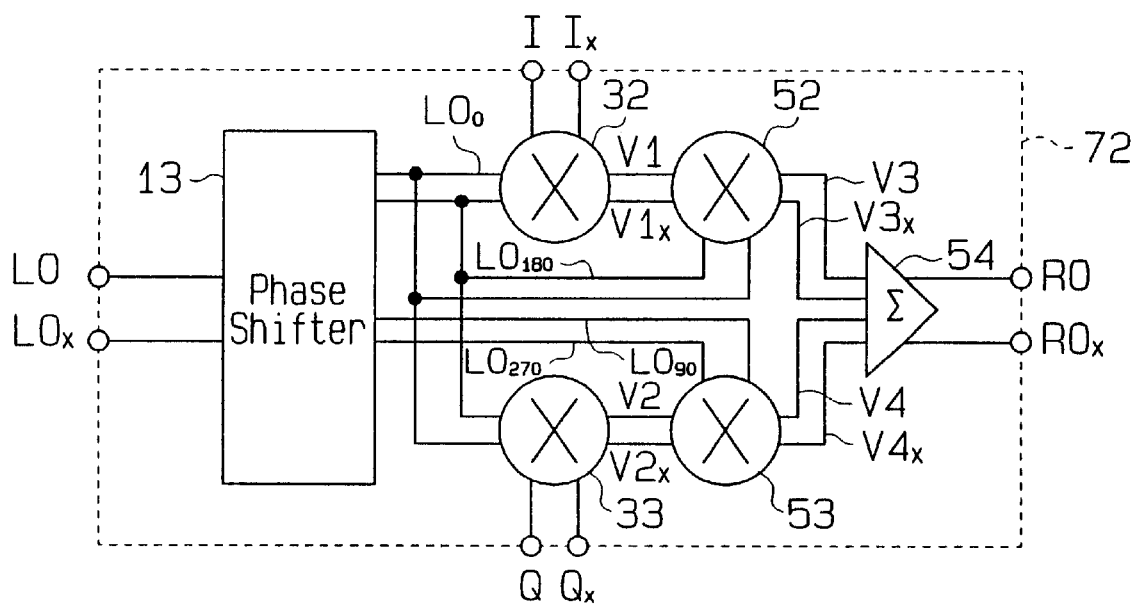
FIG. 15 is a schematic block diagram of a second modification of the orthogonal modulator of FIG. 11.

FIG. 15 is a schematic block diagram of an orthogonal modulator 72 according to a second modification of the second embodiment. The first modulation mixer 32 multiplies the in-phase carrier signals LO0 and LO180 by the first baseband signals I and Ix to produce the first modulation signals V1 and V1x. The first frequency multiplier 52 multiplies the first modulation signals V1 and V1x by the in-phase carrier signals LO0 and LO180 to yield the third modulation signals V3 and V3x.

The second modulation mixer 33 multiplies the in-phase carrier signals LO0 and LO180 by the second baseband signals Q and Qx to produce the second modulation signals V2 and V2x. The second frequency multiplier 53 multiplies the second modulation signals V2 and V2x by the orthogonal carrier signals LO90 and LO270 to yield the fourth modulation signals V4 and V4x.

The output signal Iout (the first signal V1 or V1x) of the first modulation mixer 32 is given by the aforementioned equation (7). The output signal Iout2 (the third modulation signal V3 or V3x) of the first frequency multiplier 52 is given by the equation (8).

The output signal Qout (the second modulation signal V2 or V2x) of the second modulation mixer 33 is given by the following equation (15).

$$Qout = \cos 2\pi \cdot f_{LO}/2 \cdot t \times \cos(2\pi f_{BB}t + 90°) \quad (15)$$
$$= \frac{1}{2}[\cos\{2\pi(f_{LO}/2 + f_{BB})t + 90°\} + \cos\{2\pi(f_{LO}/2 - f_{BB})t - 90°\}]$$

The output signal Qout2 (the fourth modulation signal V4 or V4x) of the second frequency multiplier 53 is given by the following equation (16).

$$Qout2 = \frac{1}{2}[\cos\{2\pi(f_{LO}/2 + f_{BB})t + 90°\} + \quad (16)$$
$$\cos\{2\pi(f_{LO}/2 - f_{BB})t - 90°\}] \times \cos(2\pi \cdot f_{LO}/2 \cdot t - 90°)$$
$$= \frac{1}{4}[\cos 2\pi(f_{LO} + f_{BB})t - \cos 2\pi f_{BB}t + \{-\cos 2\pi(f_{LO} - f_{BB})t + \cos 2\pi f_{BB}t\}]$$

The output signal Out (the output signal RO or ROx) of the adder 54 is given by the following equation (17).

$$Out = Iout2 + Qout2 \quad (17)$$
$$= \frac{1}{2}\{\cos 2\pi(f_{LO} + f_{BB})t + \cos 2\pi f_{BB}t\}$$

It is apparent from the equation (17) that the orthogonal modulator 72 of the second modification reduces the influence of the carrier leak to the output signal Out.

It should be apparent to those skilled in the art that the present invention may be embodied in many other specific forms without departing from the spirit or scope of the invention. Therefore, the present examples and embodiment are to be considered as illustrative and not restrictive and the invention is not to be limited to the details given herein, but may be modified within the scope and equivalence of the appended claims.

What is claimed is:

1. A modulation mixer for use in an orthogonal modulator, for combining a carrier signal having a high frequency and a baseband signal having a low frequency and outputting a modulation signal, comprising:
   a first transistor receiving the carrier signal;
   a second transistor receiving the baseband signal, wherein only said second transistor has
      an element for reducing a high-frequency component of a leaked carrier signal input together with the baseband signal, wherein the element includes a capacitor connected between one of a base and a collector of the second transistor and ground.

2. A modulation mixer for use in an orthogonal modulator, for combining a carrier signal having a high frequency and a baseband signal having a low frequency and outputting a modulation signal, comprising:
   a first transistor receiving the carrier signal;
   a second transistor receiving the baseband signal, wherein only the second transistor has
      an element for reducing a frequency characteristic of the transistor with respect to a high-frequency component of a leaked carrier signal input together with the baseband signal, wherein the element is connected between a collector and a base of the second transistor for giving negative feedback.

3. The modulation mixer according to claim 2, wherein the element is a resistor.

4. The modulation mixer according to claim 2, wherein the element is a capacitor.

5. A modulation mixer for use in an orthogonal modulator, for combining a carrier signal having a high frequency and a baseband signal having a low frequency and outputting a modulation signal, comprising:
   a first transistor receiving the baseband signal; and
   a second transistor receiving the carrier signal,
      the first transistor having a larger size than the second transistor to reduce a frequency characteristic of the first transistor with respect to a high-frequency component of a signal including a leaked carrier signal input together with the baseband signal to the first transistor.

6. The modulation mixer according to claim 5, wherein the first transistor has a size greater than a size of the second transistor by approximately ten to twenty times.

7. An orthogonal modulator for producing a modulation signal, comprising:

a frequency multiplier receiving a carrier signal having a high frequency and producing a complementary frequency-multiplied signal having a frequency about two times the frequency of the carrier signal;

a phase shifter, connected to the frequency multiplier, receiving the complementary frequency-multiplied signal and frequency-dividing the complementary frequency-multiplied signal by two to produce an in-phase carrier signal having an in-phase component and an orthogonal carrier signal having an orthogonal component;

a first modulation mixer, connected to the phase shifter, receiving the in-phase carrier signal and a first baseband signal having a lower frequency than the in-phase carrier signal, and combining the in-phase carrier signal and the first baseband signal to produce a first modulation signal;

a second modulation mixer, connected to the phase shifter, receiving the orthogonal carrier signal and a second baseband signal having a lower frequency than the orthogonal carrier signal, and combining the orthogonal carrier signal and the second baseband signal to produce a second modulation signal; and an adder, connected to the first and second modulation mixers, for receiving the first and second modulation signals from the first and second modulation mixers and adding the first and second modulation signals to generate the modulation signal of the orthogonal modulator, wherein the first modulation mixer includes a first transistor receiving the first baseband signal, and a first element, connected to the first transistor, for reducing a high-frequency component of a signal including a leaked carrier signal input together with the first baseband signal to the first transistor, and the second modulation mixer includes a second transistor receiving the second baseband signal, and a second element, connected to the second transistor, for reducing a high-frequency component of a signal including a leaked carrier signal input together with the second baseband signal to the second transistor, wherein each of the first and second elements includes a capacitor connected between one of a base and a collector of the associated one of the first and second transistors and ground.

8. An orthogonal modulator for producing a modulation signal, comprising:

a frequency multiplier for receiving a carrier signal having a high frequency and producing a complementary frequency-multiplied signal having a frequency about two times the frequency of the carrier signal;

a phase shifter, connected to the frequency multiplier, for receiving the complementary frequency-multiplied signal and frequency-dividing the complementary frequency-multiplied signal by two to produce an in-phase carrier signal having an in-phase component and an orthogonal carrier signal having an orthogonal component;

a first modulation mixer, connected to the phase shifter, for receiving the in-phase carrier signal and a first baseband signal having a lower frequency than the in-phase carrier signal, and combining the in-phase carrier signal and the first baseband signal to produce a first modulation signal;

a second modulation mixer, connected to the phase shifter, for receiving the orthogonal carrier signal and a second baseband signal having a lower frequency than the orthogonal carrier signal, and combining the orthogonal carrier signal and the second baseband signal to produce a second modulation signal; and an adder, connected to the first and second modulation mixers, for receiving the first and second modulation signals from the first and second modulation mixers and adding the first and second modulation signals to generate the modulation signal of the orthogonal modulator, wherein the first modulation mixer includes a first transistor receiving the first baseband signal, and a first element, connected to the first transistor, for reducing a frequency characteristic of the first transistor with respect to a high-frequency component of a signal including a leaked carrier signal input together with the first baseband signal to the first transistor, and the second modulation mixer includes a second transistor receiving the second baseband signal, and a second element, connected to the second transistor, for reducing a frequency characteristic of the second transistor with respect to a high-frequency component of a signal including a leaked carrier signal input together with the second baseband signal to the second transistor, wherein each of the first and second elements is connected between a base and a collector of the associated one of the first and second transistors for giving negative feedback.

9. The orthogonal modulator according to claim 8, wherein the first and second elements are resistors.

10. The orthogonal modulator according to claim 8, wherein the first and second elements are capacitors.

11. An orthogonal modulator for producing a modulation signal comprising:

a frequency multiplier for receiving a carrier signal having a high frequency and producing a complementary frequency-multiplied signal a frequency about two times the frequency of the carrier signal;

a phase shifter, connected to the frequency multiplier, for receiving the complementary frequency-multiplied signal and frequency-dividing the complementary frequency-multiplied signal by two to produce an in-phase carrier signal having an in-phase component and an orthogonal carrier signal having an orthogonal component;

a first modulation mixer, connected to the phase shifter, for receiving the in-phase carrier signal and a first baseband signal having a lower frequency than the in-phase carrier signal, and combining the in-phase carrier signal and the first baseband signal to produce a first modulation signal;

a second modulation mixer, connected to the phase shifter, for receiving the orthogonal carrier signal and a second baseband signal having a lower frequency than the orthogonal carrier signal, and combining the orthogonal carrier signal and the second baseband signal to produce a second modulation signal; and an adder, connected to the first and second modulation mixers, for receiving the first and second modulation signals from the first and second modulation mixers and adding the first and second modulation signals to generate the modulation signal of the orthogonal modulator, wherein the first modulation mixer includes
a first transistor receiving the first baseband signal; and
a second transistor receiving the in-phase carrier signal,
the first transistor having a larger size than the second transistor to reduce a frequency characteristic of the first transistor with respect to a high-frequency component of a signal including a leaked carrier signal input together with the first baseband signal to the first transistor, and
the second modulation mixer includes
a third transistor receiving the second baseband signal; and
a fourth transistor receiving the orthogonal carrier signal,
the third transistor having a larger size than the fourth transistor to reduce a frequency characteristic of the third transistor with respect to a high-frequency component of a signal including a leaked carrier signal input together with the second baseband signal to the third transistor.

12. The orthogonal modulator according to claim 11, wherein the first transistor has a size greater than that of the second transistor by approximately ten to twenty times, and the third transistor has a size greater than that of the fourth transistor by approximately ten to twenty times.

13. An orthogonal modulator for producing a modulation signal, comprising:

a phase shifter for receiving a carrier signal having a predetermined frequency and dividing the frequency of the carrier signal by two to generate an in-phase carrier signal having an in-phase component and an orthogonal carrier signal having an orthogonal component;

a first modulation mixer, connected to the phase shifter, for receiving the in-phase carrier signal and a first baseband signal having a lower frequency than the in-phase carrier signal, and combining the in-phase carrier signal and the first baseband signal to produce a first modulation signal;

a second modulation mixer, connected to the phase shifter, for receiving the orthogonal carrier signal and a second baseband signal having a lower frequency than the orthogonal carrier signal, and combining the orthogonal carrier signal and the second baseband signal to produce a second modulation signal;

a first frequency multiplier, connected to the first modulation mixer and the phase shifter, for receiving the first modulation signal and one of the in-phase carrier signal and the orthogonal carrier signal, and multiplying the first modulation signal by the one of the in-phase carrier signal and the orthogonal carrier signal to produce a third modulation signal;

a second frequency multiplier, connected to the second modulation mixer and the phase shifter, for receiving the second modulation signal and one of the in-phase carrier signal and the orthogonal carrier signal, and multiplying the second modulation signal by the one of the in-phase carrier signal and the orthogonal carrier signal to produce a fourth modulation signal; and an adder, connected to the first and second frequency multipliers, for receiving the third and fourth modulation signals and adding the third and fourth modulation signals to produce the modulation signal of the orthogonal modulator.

14. The orthogonal modulator according to claim 13, wherein the first frequency multiplier receives the first modulation signal and the in-phase carrier signal, and multiplies the first modulation signal by the in-phase carrier signal to produce the third modulation signal; and the second frequency multiplier receives the second modulation signal and the in-phase carrier signal, and multiplies the second modulation signal by the in-phase carrier signal to produce the fourth modulation signal.

15. The orthogonal modulator according to claim 13, wherein the first frequency multiplier receives the first modulation signal and the orthogonal carrier signal, and multiplies the first modulation signal by the orthogonal carrier signal to produce the third modulation signal; and the second frequency multiplier receives the second modulation signal and the orthogonal carrier signal, and multiplies the second modulation signal by the orthogonal carrier signal to produce the fourth modulation signal.

16. An orthogonal modulator for producing a modulation signal, comprising:

a phase shifter for receiving a carrier signal having a predetermined frequency and dividing the frequency of the carrier signal by two to generate an in-phase carrier signal having an in-phase component and an orthogonal carrier signal having an orthogonal component;

a first modulation mixer, connected to the phase shifter, for receiving the in-phase carrier signal and a first baseband signal having a lower frequency than the in-phase carrier signal, and combining the in-phase carrier signal and the first baseband signal to produce a first modulation signal;

a second modulation mixer, connected to the phase shifter, for receiving the in-phase carrier signal and a second baseband signal having a lower frequency than the in-phase carrier signal, and combining the in-phase carrier signal and the second baseband signal to produce a second modulation signal;

a first frequency multiplier, connected to the first modulation mixer and the phase shifter, for receiving the first modulation signal and the in-phase carrier signal, and multiplying the first modulation signal by the in-phase carrier signal to produce a third modulation signal;

a second frequency multiplier, connected to the second modulation mixer and the phase shifter, for receiving the second modulation signal and the orthogonal carrier signal, and multiplying the second modulation signal by the orthogonal carrier signal to produce a fourth modulation signal; and an adder, connected to the first and second frequency multipliers, for receiving the third and fourth modulation signals and adding the third and fourth modulation signals to produce the modulation signal of the orthogonal modulator.

* * * * *